US010594038B2

(12) United States Patent
Cohen et al.

(10) Patent No.: US 10,594,038 B2
(45) Date of Patent: Mar. 17, 2020

(54) FRACTAL METAMATERIAL CAGE ANTENNAS

(71) Applicant: Fractal Antenna Systems, Inc., Bedford, MA (US)

(72) Inventors: Nathan Cohen, Belmont, MA (US); Daniel Earle, Waltham, MA (US); Justin Mitchell, Waltham, MA (US)

(73) Assignee: Fractal Antenna Systems, Inc., Bedford, MA (US)

( * ) Notice: Subject to any disclaimer, the term of this patent is extended or adjusted under 35 U.S.C. 154(b) by 0 days.

(21) Appl. No.: 15/528,397

(22) PCT Filed: Nov. 19, 2015

(86) PCT No.: PCT/US2015/061697
§ 371 (c)(1),
(2) Date: May 19, 2017

(87) PCT Pub. No.: WO2016/081779
PCT Pub. Date: May 26, 2016

(65) Prior Publication Data

US 2018/0040958 A1 Feb. 8, 2018

Related U.S. Application Data

(60) Provisional application No. 62/123,578, filed on Nov. 20, 2014.

(51) Int. Cl.
*H01Q 9/38* (2006.01)
*H01Q 1/48* (2006.01)
(Continued)

(52) U.S. Cl.
CPC ................. *H01Q 9/38* (2013.01); *H01Q 1/42* (2013.01); *H01Q 1/48* (2013.01); *H01Q 1/526* (2013.01); *H01Q 1/364* (2013.01)

(58) Field of Classification Search
CPC .......... H01Q 3/446; H01Q 5/378; H01Q 5/49; H01Q 5/385; H01Q 9/0457; H01Q 5/40;
(Continued)

(56) References Cited

U.S. PATENT DOCUMENTS

| | | | |
|---|---|---|---|
| 2,835,893 | A | 5/1958 | Braund |
| 3,068,477 | A | 12/1962 | Tennyson |

(Continued)

FOREIGN PATENT DOCUMENTS

| | | |
|---|---|---|
| EP | 1612887 | 1/2006 |
| FR | 1163844 | 10/1958 |

OTHER PUBLICATIONS

International Search Report and Written Opinion dated Jan. 22, 2016 in PCT Application No. PCT/US2015/061697.

(Continued)

*Primary Examiner* — Dameon E Levi
*Assistant Examiner* — Jennifer F Hu
(74) *Attorney, Agent, or Firm* — Cesari and McKenna, LLP

(57) ABSTRACT

Cage antennas and related components are described. Such cage antennas include a shortened antennal element, such as a monopole (e.g., of approximately ⅛-wave height of a desired operational wavelength), which can be placed on a shortened ground plane (e.g., roughly quarter-wave size). A cage-like ensemble (e.g., a cage) can then be placed on top of but not touching the antenna element. The cage structure can have a fractal-based, folded, and/or pleated structure, among others. This cage structure can be produced either through a variety of means including but not limited to 3-D printing with either conductive materials or inductively coded materials.

9 Claims, 4 Drawing Sheets

(51) Int. Cl.
*H01Q 1/36* (2006.01)
*H01Q 1/52* (2006.01)
*H01Q 1/42* (2006.01)

(58) Field of Classification Search
CPC ............ H01Q 1/364; H01Q 1/48; H01Q 9/38; H01Q 15/0093
See application file for complete search history.

(56) References Cited

U.S. PATENT DOCUMENTS

| | | | | |
|---|---|---|---|---|
| 4,642,650 | A * | 2/1987 | Morton | H01Q 9/18 343/745 |
| 5,621,420 | A | 4/1997 | Benson | |
| 5,767,807 | A * | 6/1998 | Pritchett | H01Q 3/24 342/374 |
| 5,936,584 | A | 8/1999 | Lawrence et al. | |
| 6,452,553 | B1 * | 9/2002 | Cohen | H01Q 1/246 343/702 |
| 7,015,868 | B2 * | 3/2006 | Puente Baliarde | H01Q 1/36 343/800 |
| 7,248,223 | B2 * | 7/2007 | Habib | H01Q 1/36 |
| 7,456,799 | B1 | 11/2008 | Cohen | |
| 8,922,447 | B2 * | 12/2014 | Loh | H01Q 1/22 343/816 |
| 10,076,022 | B2 * | 9/2018 | Ishiwata | H01L 23/552 |
| 2003/0151556 | A1 * | 8/2003 | Cohen | H01Q 1/243 343/700 MS |
| 2004/0027304 | A1 * | 2/2004 | Chiang | H01Q 1/246 343/810 |
| 2006/0187134 | A1 | 8/2006 | Hoshi | |
| 2007/0171133 | A1 | 7/2007 | Cohen | |
| 2008/0136727 | A1 | 6/2008 | Bit-Babik et al. | |
| 2009/0140946 | A1 * | 6/2009 | Ziolkowski | H01Q 7/00 343/788 |
| 2009/0289865 | A1 | 11/2009 | Parsche | |
| 2011/0063189 | A1 | 3/2011 | Cohen et al. | |
| 2012/0098701 | A1 * | 4/2012 | Loh | H01Q 1/22 342/372 |
| 2014/0232608 | A1 * | 8/2014 | Zhao | H01Q 1/38 343/866 |
| 2016/0345427 | A1 * | 11/2016 | Ishiwata | H01L 23/552 |

OTHER PUBLICATIONS

Huang, W. J., et al. "A high-gain dual-band ESPAR antenna with simple on/off controlling." In 9th International Symposium on Antennas Propagation and EM Theory (ISAPE), Nov. 29, 2010, pp. 315-318, IEEE, 2010.

* cited by examiner

FRACTAL METAMATERIAL CAGE ANTENNAS

CROSS-REFERENCE TO RELATED APPLICATIONS

This application is a United States National Phase under 35 U.S.C. § 371 of International Application No. PCT/US2015/061697, filed Nov. 19, 2015, which claims priority to and the benefit of U.S. Provisional Application No. 62/123,578, filed Nov. 20, 2014 and entitled "Fractal Metamaterial Cage Antenna," the entire contents of these applications are incorporated herein by reference.

BACKGROUND

Monopole antennas are well known examples of small bandwidth moderate sized omnidirectional aerials. The previous art has attempted to expand the bandwidth and performance characteristics of monopole antennas to a variety of methods such methods include fierce widening of the monopole element and shortening the element to a ground plane what is needed is a new way to produce a high-performance monopole with a short and tight, wide bandwidth and ease of production.

SUMMARY

An aspect of this disclosure is directed to cage antennas that utilize fractal, folded, and/or pleated cage elements.

A further aspect of this disclosure is directed to systems and/or methods of making such cage antennas. For some embodiments, a three-dimensional (3D) printer may be used to make some or all of the components of such cage antennas.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

An aspect of the present disclosure is directed to a cage style antennas and related components. Embodiments of such cage antennas can provide functionality and benefits noted above as lacking in prior antennas.

In this novel approach according to the present disclosure, a shortened antennal element, such as a monopole (e.g., of approximately ⅛-wave height of a desired operational wavelength), can be placed on a shortened ground plane (e.g., roughly quarter-wave size). A cage-like ensemble (e.g., a cage) can then be placed on top of but not touching the antenna element, e.g., monopole. The cage can extend down to the ground plane itself and includes connection to it. In other words the ground plane and connected cage structure manifests as a three-dimensional structure that rises above the ground plane to an area above the apex of the antenna element (e.g., monopole) itself. The cage structure can have a fractal-based, folded, and/or pleated structure, among others. This cage structure can be produced either through a variety of means including but not limited to 3-D printing with either conductive materials or inductively coded materials. While the antenna element is described as being about ⅛ of an operational (nominal wavelength) for exemplary embodiments, it may be any desired length, e.g., ¼ of a wavelength, ½ of a wavelength, etc. for some applications and embodiments.

Figure 1:
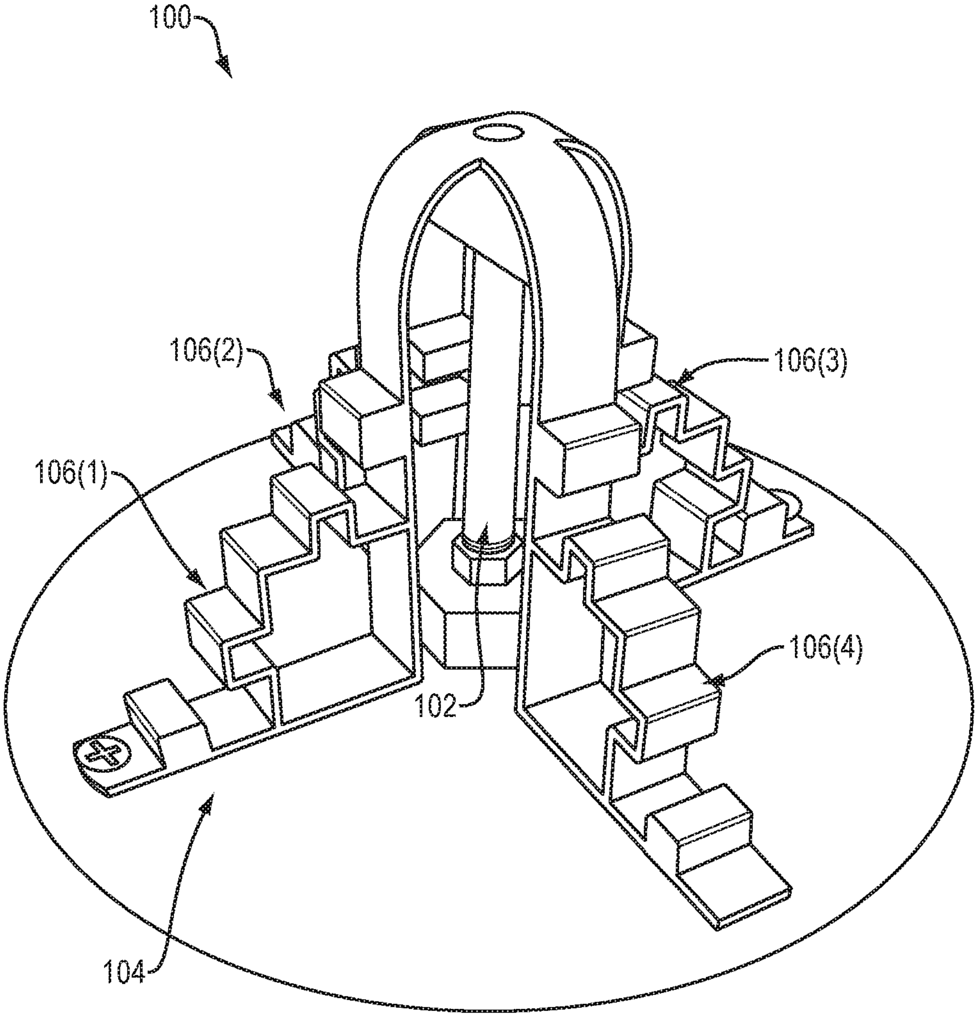
FIG. 1 shows an example of a cage antenna according to the present disclosure.

An example of such a cage antenna 100 is shown in FIG. 1. The antenna 100 can include an antenna element 102, which is shown as a monopole, as well as a ground plane 104 and a cage 106 with portions (legs) 106(1)-(4). The ground plane may be sized, e.g., as roughly ¼ ground plane or $\lambda/4$ ground plane. The cage element is a ground-plane-attached 'cage' that surrounds but does not touch the antenna element. The cage can function to load the antenna and provide a far smaller size with bandwidth and gain compatible with a far larger conventional monopole. In exemplary embodiments, the cage may be folded, pleated and/or in a fractal shape. The element may be straight (e.g., a monopole as shown in FIG. 1) or a variety of other shapes such as a bowtie, cone, fractal, and so on.

The components of antenna 100 may be made by any suitable procedure/method. In exemplary embodiments, 3D printing to make the structure. Other suitable procedures/methods for making antenna 100, or components therefor, include computer-numeric-controlled (CNC) machining or the like. An example of a suitable 3D printer is a MakerBot Replicator Z18 3D printer made available by the MakerBot Industries LLC.

Figure 2:
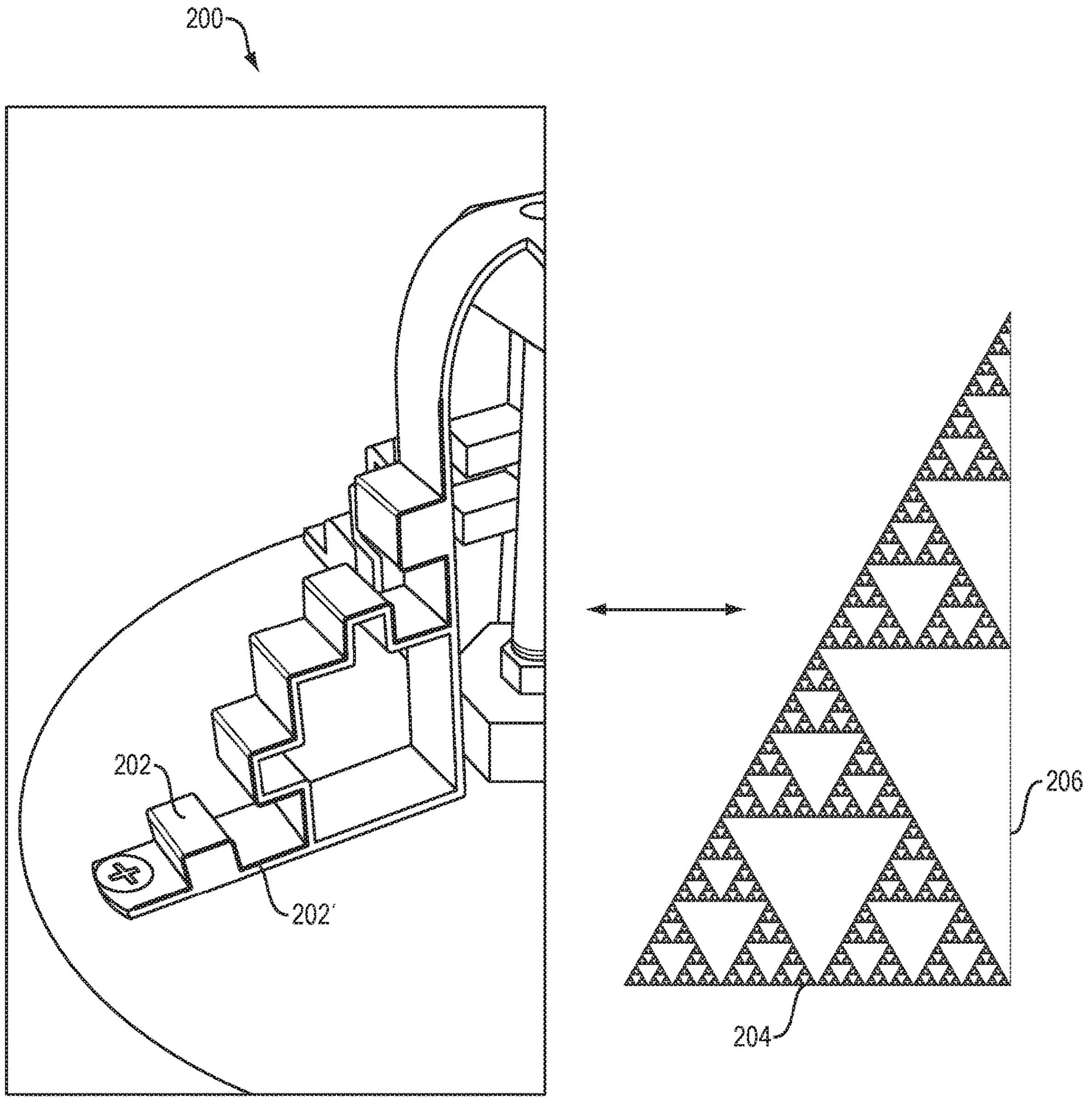
FIG. 2 depicts an enlarged portion of the cage antenna of FIG. 1.

FIG. 2 shows an enlargement 200 of one portion 202 (corresponding to 106(1)) of the cage (or cage element) 100 or FIG. 1, which portion connects to the ground plane. (While not shown in FIG. 2, other similar portions may be present, e.g., arranged radially around the dipole longitudinal axis as shown in FIG. 1.) The cage portion 202 is shown in perspective, with the general outline indicated as 202'. That outline 202' of the cage portion 202, which can be considered as an arm or leg of the cage structure, may have a fractal or fractal-like shape. While one fractal (or fractal-like) shape is shown for the outline 202', others may be used within the scope of the present disclosure. Any suitable and practical fractal or fractal-like shape may be utilized. For example, an alternate profile for cage portion 202 may be shaped as a portion of a Sierpinksi triangle or sieve (gasket)

or the like, as shown by 204 (right side of FIG. 2). Of course, suitable structural elements, e.g., 206 or the like, may be included for structural support. Other suitable fractal or self-similar (similar to itself at different scales) features may be used in addition or substitution. Other examples include, but are not limited to, (i) a Sierpinksi carpet (square) or portion of, including any type or variation, (ii) a substantially thicker version of the Sierpinski carpet including a section of a Menger sponge of any type or variation, (iii) a Koch curve, including a so-called "delta" fractal, which is a 3D extrapolation of a Koch curve, (iv) a section of a Keplerian fractal, and (v) any other suitable 2D or 3D fractal or fractal like shape.

Such antenna cages or cage elements (or, components) may be made of any suitable material. Examples include, but are not limited to metal-coated plastic, solid metal, or any other suitable conductive material. Furthermore, suitable metamaterials, such as split-ring resonators may be used, e.g., on or within the cage elements and/or ground plane.

Figure 3:
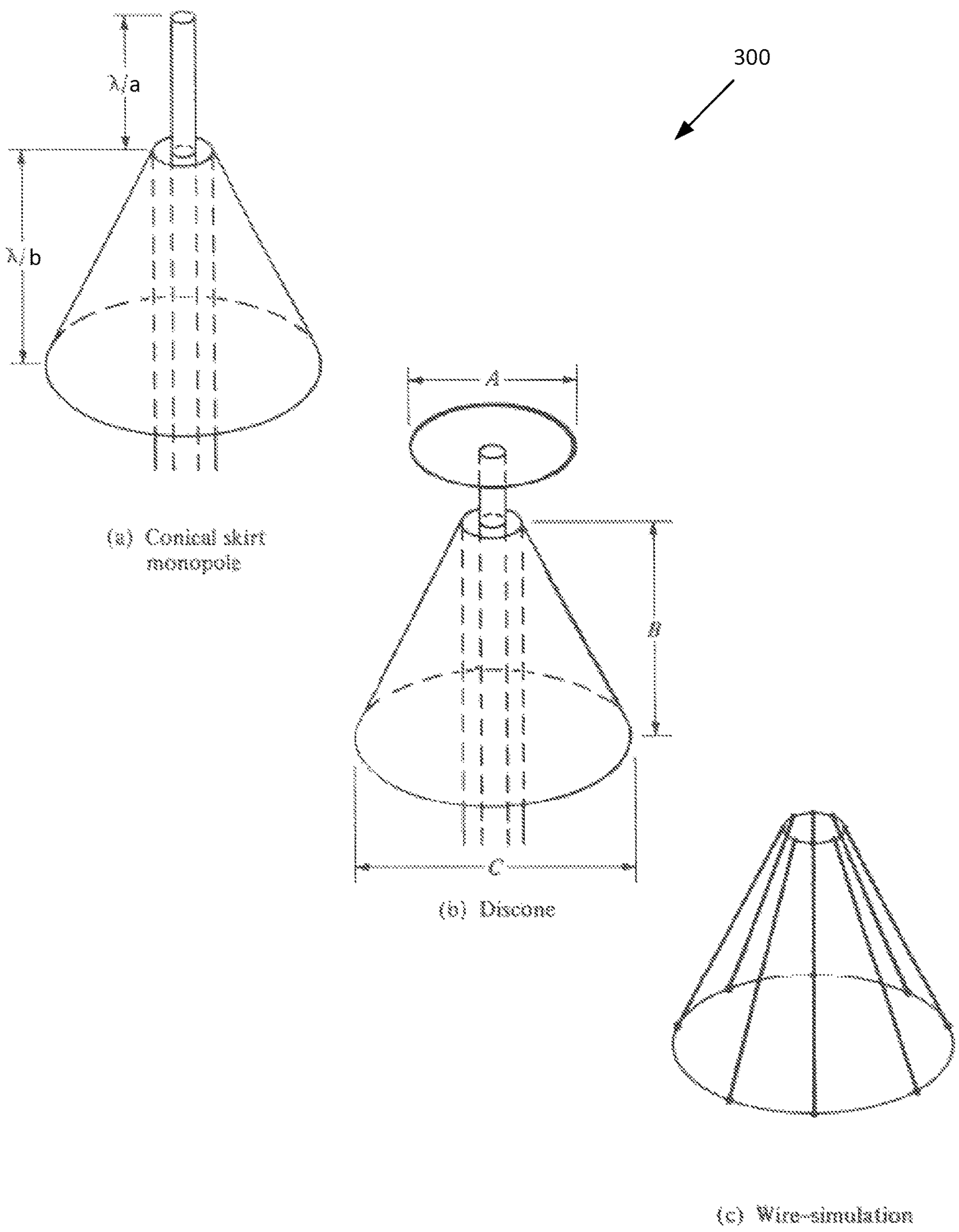
FIG. 3 depicts alternate embodiments of an antenna element used for a cage antenna in accordance with the present disclosure.

While a monopole is described above, the antennal element can have other types of configurations within the scope of the present disclosure. FIG. 3 depicts alternate embodiments (a-c) of an antenna element used for a cage antenna in accordance with the present disclosure. As shown in (a), a cone (conical skirt) elements may be used. The indicated values of "a" and "b" can be selected/designed as desired, such that the overall height (as shown in the drawing) can be a desired value, e.g., $3/2\lambda$, $\lambda/2$, $\lambda/4$, $\lambda/8$, etc., where $\lambda$ is the wavelength of operation or nominal wavelength. As further shown in (b), the antenna element may be configured as a discone element, where the values of "A," "B," and "C" may be selected as desired. As shown in (c), a wire cage may be utilized for the antenna element in some embodiments.

A further aspect of the present disclosure is directed to novel systems capable of producing electromagnetic parts (those that are in entirety, or portions of a system, intentionally designed to propagate, guide, duct, radiate, absorb, reflect, diffract refract, resonate or re-propagate electromagnetic waves) and parts made by same. The system uses a three dimensional (3D) printer to make volumetric components that incorporate one or more folds and/or bends and/or have self-similar structure (fractal in finite iterations for at least a portion) for at least part of the component. The component may be constructed out of conductive plastic, or non-conductive plastic or other non-conductive material. Alternatively the system uses a three dimensional printer to make volumetric metal or metal coated components that incorporate one or more folds and/or have self-similar structure (fractal in finite iterations for at least a portion) for at least part of the component.

Figure 4:
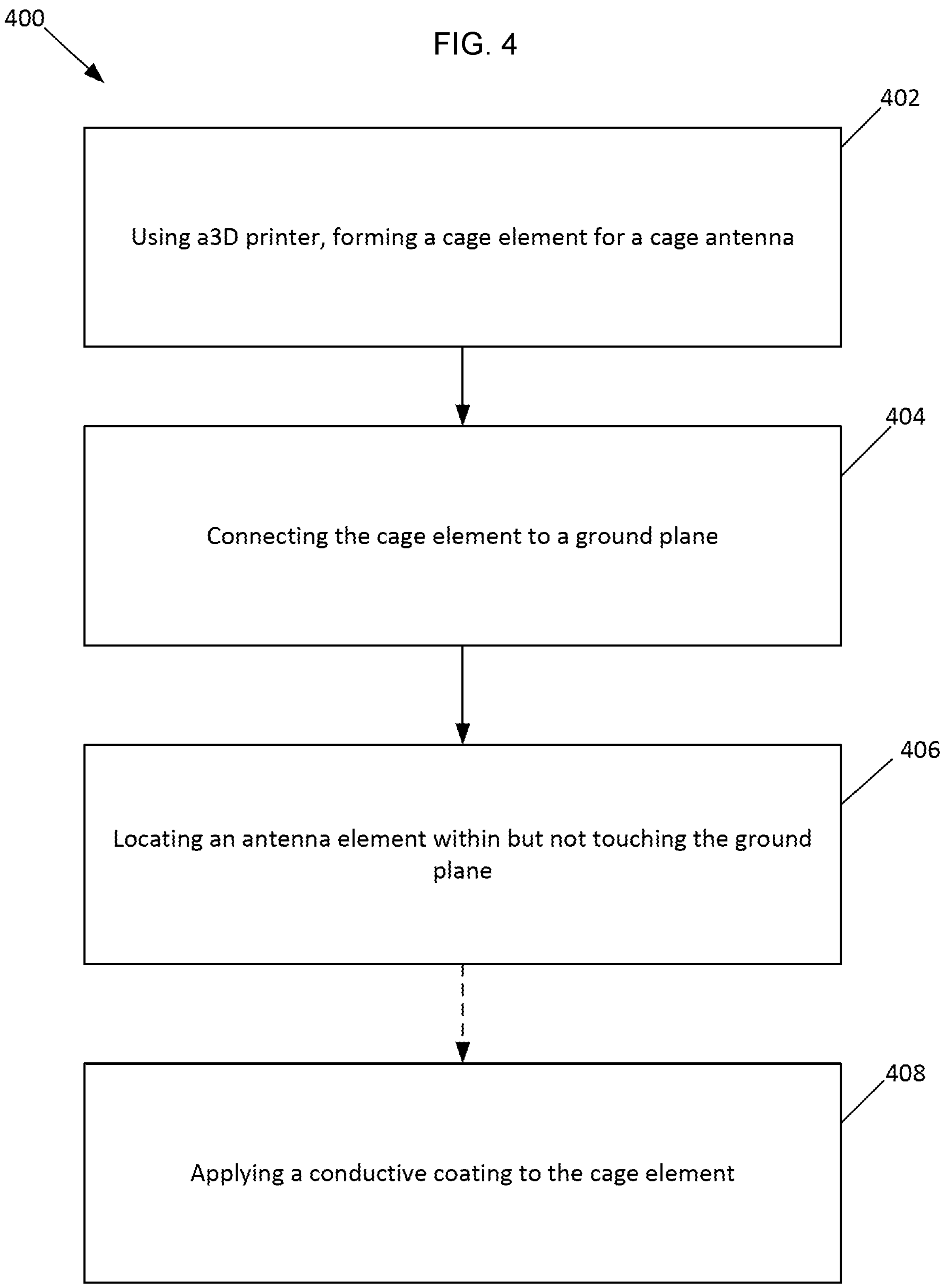
FIG. 4 depicts steps in a method of constructing a cage antenna in accordance with the present disclosure.

FIG. 4 shows steps in a method 400 according to the present disclosure. As shown, a 3D printer may be used to form or print one or more cage elements (e.g., 106(1)-(4)) of a cage antenna (e.g., 100 of FIG. 1). The cage element(s) can be connected by suitable connection (e.g., fastener as shown in FIG. 1) or welding/brazing to a ground plane (e.g., 104 in FIG. 1), as indicated by 404. The antenna element (e.g., monopole) can be located within a cage structure or cage elements or elements, without touching that/those structure/element/elements, as shown as 406. As shown at 408, various components (e.g., one or more cage elements) may be coated with conductive coating (e.g., ink or paint or plating). Of course, while 3D printers are mentioned above, other suitable fabrication machinery and/or techniques may be used to form components of a cage antenna, e.g., cage elements 106(1)-(4) in FIG. 1. Examples include but are not limited to CNC mills, CNC lathes, and multiple-axis CNC machines.

If non-conductive material is used, the component may be plated or gilded with a conductor (such as conductive paint) after printing so the component then conducts and can act as an electromagnetic component. Alternatively, the component may only be partially plated and the non-conductive material will act as a dielectric.

Unless otherwise indicated, the fractal, folded, and/or pleated shapes of antenna components (e.g., cage arms 106) that have been discussed herein may be implemented (designed and/or manufactured) with a computer system configured to perform the functions that have been described herein for the component. Each computer system includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

Each computer system for the design and/or manufacture of the above-noted antenna components may be a desktop computer or a portable computer, such as a laptop computer, a notebook computer, a tablet computer, a PDA, a smartphone, or part of a larger system, such a vehicle, appliance, and/or telephone system.

A single computer system may be shared by the multiple users or CNC machines for such design and/or manufacturing processes.

Each computer system for the design and/or manufacturing processes may include one or more computers at the same or different locations. When at different locations, the computers may be configured to communicate with one another through a wired and/or wireless network communication system.

Each computer system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/ or advantages. These also include embodiments in which the components and/or steps are arranged and/or ordered differently.

For example, while certain fractal shapes have been described above, others may be used. Also, fractal shapes can be used that have any suitable order (level of iteration of the generator shape). For further example, while certain context has been provided above for use of the disclosed antennas at certain RF frequencies or wavelengths, other frequencies and wavelengths of electromagnetic energy may be used within the scope of the present disclosure.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A cage antenna comprising:

an antenna element configured as a monopole and having an apex and configured to receive RF energy;

a ground plane; and a cage connected to the ground plane, wherein the cage includes a plurality of arms having first and second ends, wherein each arm is connected at the first end to a different location on the ground plane and is connected at the second end to a respective second end of one or more of the other arms at a location directly above the apex of the antenna element, relative to the ground plane, wherein one or more arms of the plurality of arms comprises a fractal shape, and wherein the cage surrounds but does not touch the antenna element.

2. The cage antenna of claim 1, wherein the ground plane is about ¼ of a desired operational wavelength.

3. The cage antenna of claim 1, wherein the antenna element comprises a monopole has a length of that is about ⅛ of a desired operational wavelength.

4. The cage antenna of claim 1, wherein the antenna element comprises a conical skirt monopole.

5. The cage antenna of claim 1, wherein the antenna element comprises a discone antenna element.

6. The cage antenna of claim 1, wherein the cage comprises a folded shape.

7. The cage antenna of claim 1, wherein the cage comprises a pleated shape.

8. The cage antenna of claim 1, wherein the fractal shape comprises a Sierpinski triangle.

9. The cage antenna of claim 1, wherein the fractal shape comprises a Koch curve.

* * * * *